US012164730B2

(12) United States Patent
Bytheway et al.

(10) Patent No.: US 12,164,730 B2
(45) Date of Patent: Dec. 10, 2024

(54) HUMAN BODY SENSOR SYSTEM USING SIGNAL PHASE SHIFT

(71) Applicant: Alps Alpine Co., Ltd., Tokyo (JP)

(72) Inventors: Jared Bytheway, Sandy, UT (US); Tomoki Yamada, Tokyo (JP)

(73) Assignee: Alps Alpine Co., Ltd. (JP)

( * ) Notice: Subject to any disclaimer, the term of this patent is extended or adjusted under 35 U.S.C. 154(b) by 0 days.

(21) Appl. No.: 17/455,728

(22) Filed: Nov. 19, 2021

(65) Prior Publication Data

US 2023/0161065 A1     May 25, 2023

(51) Int. Cl.
| | | |
|---|---|---|
| *G06F 3/044* | (2006.01) | |
| *B60R 16/027* | (2006.01) | |
| *B62D 1/04* | (2006.01) | |
| *G01R 27/26* | (2006.01) | |
| *G01V 3/08* | (2006.01) | |

(52) U.S. Cl.
CPC ............ *G06F 3/044* (2013.01); *B60R 16/027* (2013.01); *B62D 1/046* (2013.01); *G01R 27/2605* (2013.01); *G01V 3/088* (2013.01)

(58) Field of Classification Search
CPC ...... G01V 3/088; B60R 16/027; B62D 1/046; G01R 27/2605; G06F 3/044
See application file for complete search history.

(56) References Cited

U.S. PATENT DOCUMENTS

| | | | | |
|---|---|---|---|---|
| 6,392,542 | B1 * | 5/2002 | Stanley | .................... B60N 2/28 |
| | | | | 701/45 |
| 9,827,996 | B2 | 11/2017 | McMillen et al. | |
| 2015/0022489 | A1 * | 1/2015 | Gossner | .............. G06F 3/04182 |
| | | | | 345/174 |
| 2016/0375910 | A1 | 12/2016 | McMillen et al. | |
| 2019/0187828 | A1 * | 6/2019 | Hosur | ..................... G06F 3/044 |

FOREIGN PATENT DOCUMENTS

| | | | |
|---|---|---|---|
| DE | 2020-06005593 U1 | 8/2006 | |
| JP | 6466307 B2 | 2/2019 | |
| KR | 20140080605 A * | 7/2014 | ............. G06F 3/044 |

OTHER PUBLICATIONS

International Preliminary Report on Patentability issued in the corresponding International Application No. PCT/US2022/045011; issued on May 2, 2024 (total 7 pages).

\* cited by examiner

*Primary Examiner* — Amy He
(74) *Attorney, Agent, or Firm* — Harness, Dickey & Pierce, P.L.C.

(57) ABSTRACT

A human body detecting sensor system includes a first electrode, a second electrode, a drive circuit, a detection circuit, and a comparison circuit. The second electrode is connected to the first electrode via a capacitor. The drive circuit generates a first signal having a prescribed frequency for driving the first electrode. The detection circuit detects a second signal generated at the second electrode in response to the first signal being supplied to the first electrode. The comparison circuit compares the first signal with the second signal. The comparison circuit detects a touch and/or an approach of an object, which has an impedance in a certain range corresponding to a human body, with respect to at least one of the first and second electrodes when a phase difference between the first signal and the second signal is within a prescribed range.

15 Claims, 7 Drawing Sheets

FIG. 7

HUMAN BODY SENSOR SYSTEM USING SIGNAL PHASE SHIFT

FIELD

The present disclosure relates to capacitive sensors, and more particularly to a human body detecting sensor system that detects a touch and/or an approach of a human body by using a phase difference between a drive signal and a sensed signal.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A capacitive sensor may be used to sense contact between an object (e.g., a finger) and a surface of an object, such as a surface of a steering wheel of a vehicle, and generate a signal indicative of the sensed contact. For example, a waveform generator can be configured to generate and output a signal to the capacitive sensor. In some examples, as described in U.S. Pat. No. 9,827,996, a steering wheel sensor system has a flexible piezoelectric substrate and an array of sensors wrapped around the steering wheel that detects a contact (grip) force associated with the array of sensors exceeding a threshold for a specified duration. Accordingly, the presence or absence of an object contacting the sensor can be determined based on a physical quantity value from the sensors.

SUMMARY

1. Technical Problem

Unfortunately, however, the above described capacitive sensor may not quantify the capacitance Cfr between the human body and the sensor, but rather may instead quantify the series combined capacitance Cfr*Cfg/(Cfr+Cfg) of the coupling capacitance Cfg between the human body and ground and the capacitance Cfr between the human body and the sensor. Therefore, the capacitive sensor may not accurately distinguish contact by the human body from contact by other objects such as a liquid or a grounded metal.

2. Solution to Problem

A human body detecting sensor system includes a first electrode, a second electrode, a drive circuit, a detection circuit, and a comparison circuit. The second electrode is connected to the first electrode via a capacitance. The drive circuit is configured to generate a first signal having a prescribed frequency that is supplied to the first electrode. The detection circuit is configured to detect a second signal generated at the second electrode in response to the first signal being supplied to the first electrode. The comparison circuit is configured to compare the first signal with the second signal. Advantageously, the comparison circuit is configured to detect a touch and/or an approach of a human body with respect to at least one of the first and second electrodes when a phase difference and an amplitude difference between the first signal and the second signal are within a prescribed range.

In other features, in the human body detecting sensor system, the drive circuit is configured to select the predetermined frequency of the first signal from a plurality of frequencies.

In other features, in the human body detecting sensor system, the capacitance is adjusted based on the selected predetermined frequency of the first signal.

In other features, in the human body detecting sensor system, an impedance between the second electrode and a ground potential is adjusted based on the selected predetermined frequency of the first signal.

In other features, in the human body detecting sensor system, the first electrode is arranged in a steering wheel.

In other features, in the human body detecting sensor system, the first electrode and/or the second electrode is arranged in a steering wheel.

In other features, in the human body detecting sensor system, the prescribed frequency of the first signal is in a range of 1 MHz to 100 MHz.

In other features, in the human body detecting sensor system, the comparison circuit is configured to detect the touch and/or the approach of an object, which has an impedance in a certain range corresponding to a human body, with respect to the second electrode when the phase difference between the first signal and the second signal is within the prescribed range.

In other features, in the human body detecting sensor system, the comparison circuit is configured to detect the touch and/or the approach of an object, which has an impedance corresponding to a human body, with respect to the second electrode when an amplitude difference between the first signal and the second signal is within another prescribed range.

In other features, in the human body detecting sensor system, the prescribed range of the phase difference is in a range of 1 degree to 42 degrees as a phase shift and more particularly, is in a range of 26 degrees to 42 degrees as a phase shift. These ranges are defined based on the experiments using phase components $\phi$ and $\phi'$ of a combined impedance Zall discussed later in detail.

In other features, in the human body detecting sensor system, a size of the second electrode and a thickness of an overlay of the second electrode are set such that when a surface touched by the human body with respect to the overlay of the second electrode is detected, a capacitance between the human body and the second electrode becomes the same as a capacitive component of the human body.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A capacitive touch sensor senses the change in capacitance between a transmitter and receiver in a 'mutual capacitance' type sensor; or the loading of a single electrode receiver in a 'self-capacitance' type sensor. If a floating or small surface area conductor comes in close proximity to a mutual cap sensor, the sensed capacitance, Ctr, increases. If that same conductive object is grounded or its surface area is substantially increased, the sensed capacitance, Ctr, decreases. A very similar behavior is observed with a high dielectric, non-conductive object. If a conductive or high dielectric object comes in close proximity to a self-capacitance sensor electrode and ground, then the sensed capacitance decreases. If a small object is electrically floating near the sensing electrode, no change in capacitance is detected. A human body typically has 100-200 pF of capacitance from conductive skin surface area. Many touch sensors see this as enough capacitance to look like a mostly grounded conductive object. Most capacitance touch sensors flag a 'touch' when the capacitance change is above some nominal threshold.

A change in a signal supplied to a capacitive sensor (corresponding to a sensed signal) in response to contact with an object is typically small relative to a supplied signal (i.e., a control, an excitation, or drive signal) and it may be difficult to distinguish touches by a human body, such as with the fingers or hands, from touching by a non-human object, such as with a water based liquid (conductive or not) that is also close to ground. A similar behavior can be seen for a grounded conductor (a metal conductor such as aluminum foil). For example, when a non-human object touches a capacitive sensor and the capacitive sensor generates a sensed signal corresponding to a physical quantity of touching, the capacitive sensor may erroneously determine that the detected physical quantity is a result of touching by a human body.

In some examples, a self-capacitance sensor can quantify a capacitance between a sensor element and a detection target. The self-capacitance sensor actually quantifies a combined capacitance between the detection target, the sensor element and the ground potential. Specifically, when a human body approaches the sensor element, the sensor element does not quantify a capacitance Cfr between the human body and the sensor element, but does quantify a series combined capacitance (Cfr×Cfg/(Cfr+Cfg)) of the capacitance Cfr (between the human body and the sensor element) and a capacitance Cfg between the human body and the ground potential. Thus, because a water bottle (a liquid or floating conductor) may have a capacitance Cwg between the water bottle (a liquid or floating conductor) and the ground potential that is similar to the capacitance Cfg between the human body and the ground potential, the sensor element may not correctly detect whether the detection target is a human body or a water bottle (liquid or floating conductor). In addition, because a grounded conductor (metal) is grounded, the sensor element may not correctly detect whether the detection target is a human body or a grounded conductor (metal). Specifically, depending on the size of the electrodes and distance to a touch and depending on how 'grounded' a human body is, the capacitance of the sensor element can change in the same manner as the grounded conductor (metal). The range of capacitance change from a human body is quite large depending on the 'groundedness' of the human body, an area of the touch, a distance from the touch, sweat and so on compared with the grounded conductor (metal). Since the electrodes of the sensor element are typically insulated, galvanic connections to a sensed object are not possible. Nonetheless, capacitive connections are possible.

Figure 1:
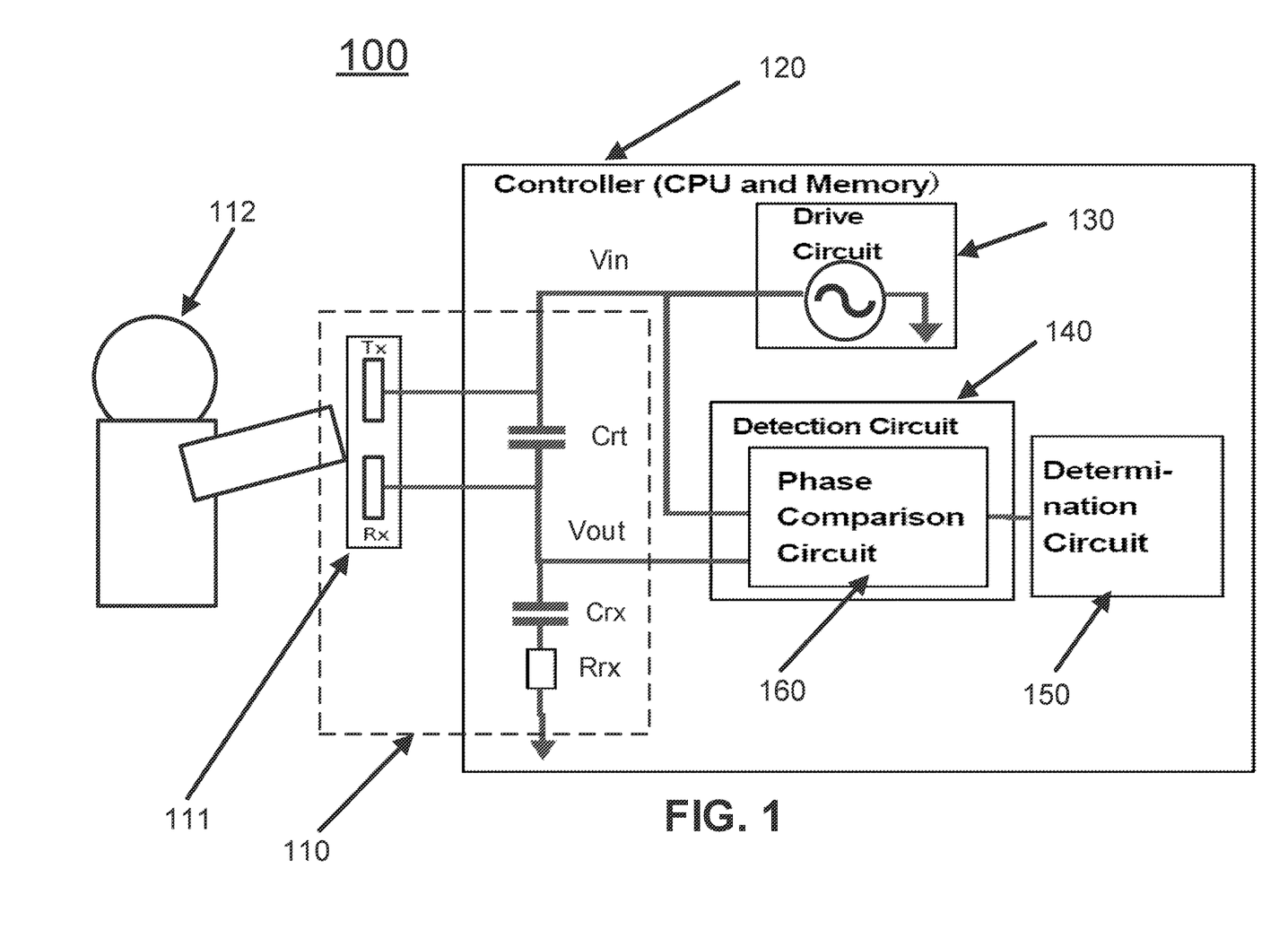
FIG. 1 is an example human body detecting system including a capacitive sensor with two electrodes and a controller.

Referring now to FIG. 1, an example human body detecting system 100 including a sensor module 110 corresponding to a capacitive sensor and a sensor controller (including a CPU and a memory as discussed below) 120 is shown. The sensor module 110 includes a first electrode Tx and a second electrode Rx. The first electrode Tx and the second electrode Rx are typically close together in proximity to form a capacitor Crt. But, if an additional signal is required, a discrete capacitor may be added in parallel to the first electrode Tx and the second electrode Rx. The sensor controller 120 includes a CPU (processor), a memory, such as a RAM, a ROM, and an EEPROM, a DAC, an ADC, amplifiers, and filters to control a drive circuit 130, a detection circuit 140, a determination circuit 150, and a phase comparison circuit 160 by executing a program or a command stored in the memory by the processor. The detection circuit 140 includes the phase comparison circuit 160.

Figure 4:
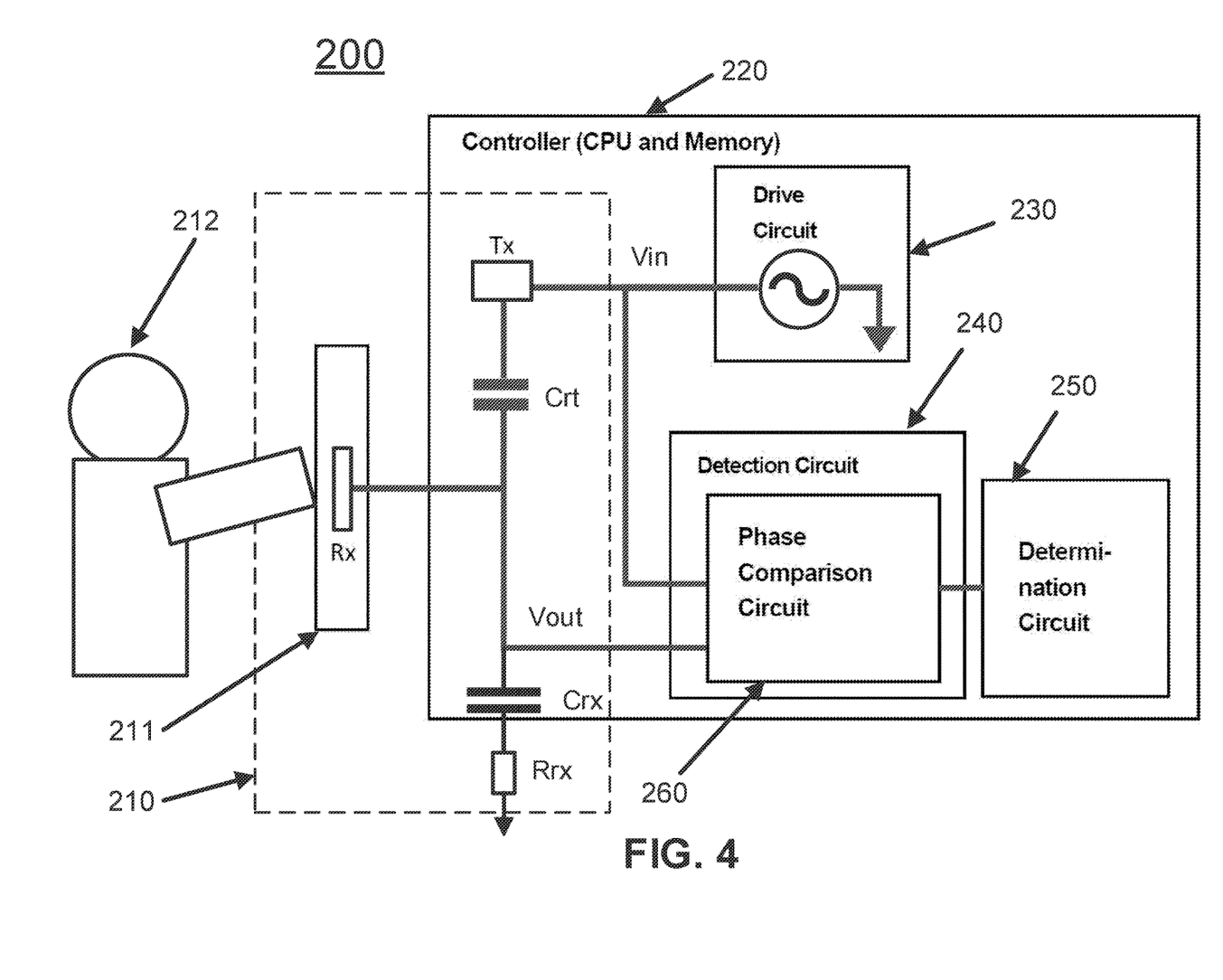
FIG. 4 is an example human body detecting system including a capacitive sensor with one electrode and a controller.

In some examples, the second electrode Rx is arranged in or wrapped around or cover a core material of a steering wheel 111 of a vehicle. The second electrode Rx is used for detecting an approach (i.e., being within a proximity of) and/or a contact (touch) of the steering wheel 111 by a human body (e.g., fingers or hands) 112. Similarly, the first electrode Tx may be arranged in or wrapped around or cover the core material of the steering wheel 111 as shown in FIG. 1. The first electrode Tx is used for detecting an approach (i.e., being within a proximity of) and/or a contact (touch) of the steering wheel 111 by a human body (fingers or hands) 112. In some examples, the first and second electrodes Tx and Rx may be placed around or cover an entirety of the steering wheel 111. But, because the first electrode Tx is not required to be touched by the human body 112, the first electrode Tx may be arranged in a structure other than the steering wheel 111 as shown in FIG. 4. Specifically, as described later, the phase comparison circuit 160 is required to receive a drive signal Vin from the drive circuit 130 as a reference signal and a sensed signal Vout from the second electrode Rx as a sensing result signal. Thus, at least the second electrode Rx is required to be arranged at a location (e.g., the steering wheel 112) where the human body approaches or touches.

The drive circuit 130 supplies a drive signal or an excitation signal (e.g., a sinewave) Vin to the first electrode Tx of the sensor module 110 and the phase comparison circuit 160 in the detection circuit 140. The drive signal Vin has a prescribed frequency, such as 8 MHz or 10 MHz, which can be selected from a plurality of frequencies, such as from a range of 1 MHz to 100 MHz. A sensed signal (e.g., a sinewave) Vout is generated by the second electrode Rx in response to the application of the drive signal Vin to the first electrode Tx. The sensed signal Vout has a frequency corresponding to the prescribed frequency of the drive signal Vin and the capacitor Crt. Thus, depending on the capacitance of the capacitor Crt, a phase and an amplitude of a waveform of the sensed signal Vout may be substantially the same as the phase and amplitude of the drive signal Vin. The sensed signal Vout is supplied to the phase comparison circuit 160 in the detection circuit 140. Further, the sensor module 110 has an impedance hanging from the second electrode Rx, such as that represented by a capacitor Crx and a resistor Rrx shown in FIG. 1.

When part of the human body 112 approaches (i.e., becomes within a proximity of) and/or contacts (touches) the second electrode Rx and the first electrode Tx in the steering wheel 111, the sensed signal Vout is changed. Specifically, a phase of a waveform of the sensed signal Vout is shifted or delayed for a certain degree compared to a phase of a waveform of the sensed signal Vout when no object approaches and/or contacts the second electrode Rx and the first electrode Tx in the steering wheel 111. In other words, the waveform of the sensed signal Vout is shifted or delayed for a certain degree compared to a phase of a waveform of the drive signal Vin. These phase differences (shifts or delays) occur due to the resistance capacitance (RC) mix of the impedance of the human body. An amplitude of the sensed signal Vout is also changed in an acceptable range due to the approaching or touching by the human body 112.

After the phase comparison circuit 160 receives both the drive signal Vin and the sensed signal Vout, the phase comparison circuit 160 compares the two signals Vin and Vout and quantifies a difference between the two signals Vin and Vout. Specifically, the phase comparison circuit 160 compares phases and amplitudes of the two signals Vin and Vout. When the quantified difference with respect to the phases and amplitudes of the two signals Vin and Vout is within a prescribed range, the determination circuit 150 determines that the human body 112 has approached and/or touched the steering wheel 111. Particularly, as discussed in detail below, when the quantified difference (angle (degree) difference) with respect to the phases of the two signals Vin and Vout is within a prescribed range, such as equal to or more than 1° and equal to or less than 42°, and more particularly equal to or more than 26° and equal to or less than 42°, the determination circuit 150 determines that the human body 112 has approached and/or touched the steering wheel 111. The phase differences of 26° and 42° correspond to the experiments discussed below in which the phase components $\phi'$ of a combined impedance Zall are about 41.7° (41.7°−0°=41.7°) and 26.2° (40.9°−14.7°=26.2°).

Conversely, as discussed in detail below, when a liquid (floating conductor) or a metal (grounded conductor) as a non-human object approaches and/or touches the steering wheel 111, the quantified difference with respect to the phases of the two signals Vin and Vout is outside a prescribed range, or there is no substantial phase difference between the two signals Vin and Vout. Specifically, if a grounded conductor, floating conductor, grounded dielectric, or floating dielectric comes in proximity to the sensor element in the steering wheel 111, no phase shift is observed at the sensed signal Vout. However, as mentioned above, if the human body 112 comes in proximity to the sensor element, a phase shift is observed because the human body also has a certain amount of an electrical resistance. The combination of the resistance and capacitance in the sensor module 110 causes a phase shift in the sensed signal Vout. Therefore, the determination circuit 160 can accurately and reliably detect the approaching and/or touching of the steering wheel 111 by the human body 112 and distinguish the human body 112 from the approaching and/or touching of the steering wheel 111 by non-human objects. As a result, vehicle safety is improved.

Figure 7:
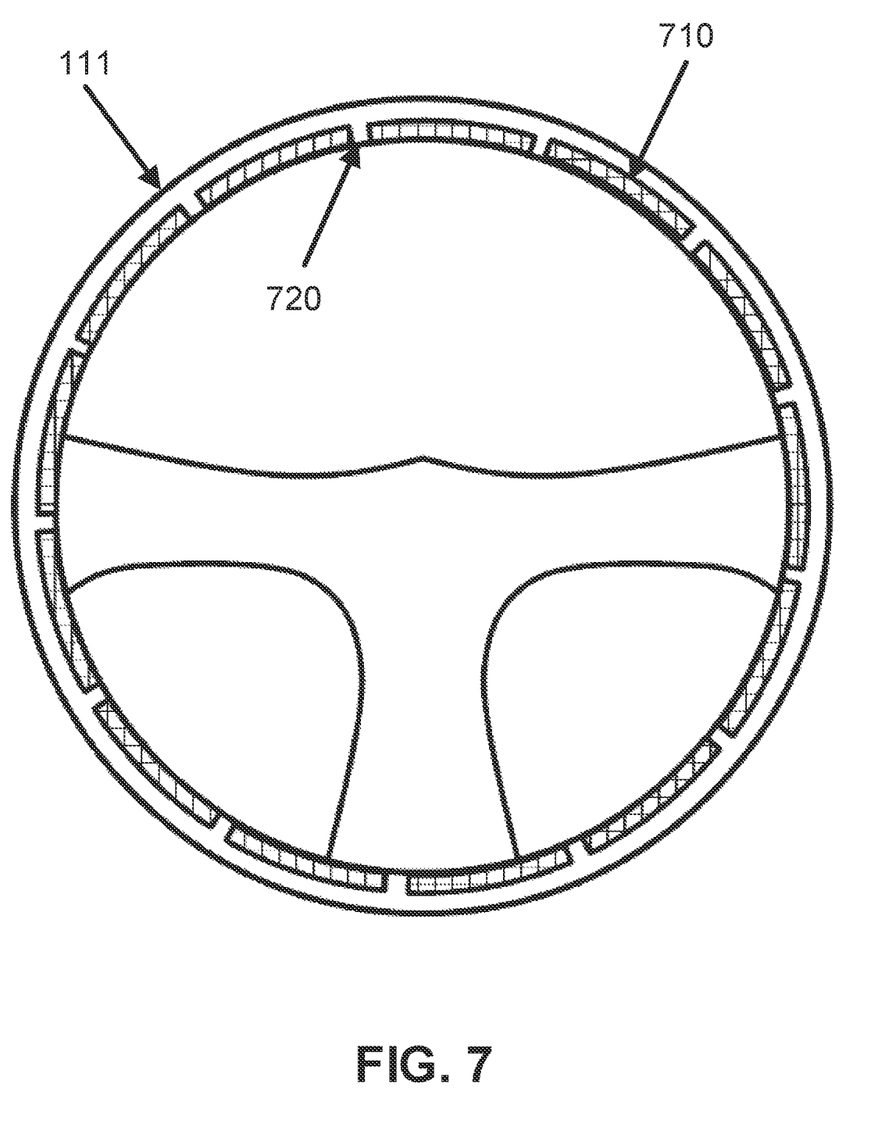
FIG. 7 is an example schematic view of a steering wheel having a plurality of electrodes.

Although a single pair of first and second electrodes Tx and Rx has been explained in the above examples, a plurality of first electrodes Tx and/or a plurality of second electrodes Rx may be arranged in the steering wheel 111. As shown in FIG. 7, for example, the steering wheel 111 may have a plurality of spaced apart electrodes 710 and a circular electrode 720. The circular electrode 720 corresponds to the first electrode Tx and the plurality of electrodes 710 correspond to the plurality of second electrodes Rx. Thus, the sensor module 110 shown in FIGS. 1 and 2 and the sensor module 210 (explained later) shown in FIG. 4 may respectively include the plurality of electrodes 710 and the circular electrode 720. This configuration can reduce the cost and complexity of the sensor modules 110 and 210.

In FIG. 7, thirteen electrodes 710 are illustrated. The number of electrodes 710, however, can be less than or more than thirteen, if desired. Further, although the circular electrode 720 is provided at an inner periphery of the steering wheel 111 in FIG. 7, the circular electrode 720 can be omitted if the sensor modules 110 and 210 are configured appropriately. Specifically, when the circular electrode 720 is omitted from the steering wheel 111, each of the electrodes 710 corresponds to a single pair of first and second electrodes Tx and Rx. In this case, each of the electrodes 710 corresponds to a single sensor module 110 or 210. An advantage of this configuration is to reduce the capacitance to ground (Crg) and thus increase a signal to noise ratio of the system 100 or 200. In an alternate configuration, the number of electrodes 710 is reduced to four and the circular electrode 720 is omitted. The four electrodes 710 are arranged at areas of the steering wheel 111 where the hands of a driver are known to frequently touch. In this case, four drive signals Vin and four sensed signals Vout are generated. Thus, there are sixteen unique pairs of signal combinations and, as a result, sixteen unique touch areas of the sensor modules 110 and 210 are created at the steering wheel 111.

In contrast and as noted above, when the circular electrode 720 is provided, it corresponds to a single second electrode Rx and the plurality of electrodes 710 correspond to the plurality of first electrodes Tx. Since the plurality of first electrodes Tx are arranged at several different places in the steering wheel 111, the sensor controller 120 can select which first electrode(s) Tx is/are supplied with the drive signal Vin from the drive circuit 130. In this example, when the detection circuit 140 does not detect a phase difference at a first specific location of the steering wheel 111 in which the selected first electrode Tx (Tx1) receives the drive signal Vin, the human body detecting system 100 can determine that the human body 112 has not approached and/or touched the first specific location of the steering wheel 111. Also, since the detection circuit 140 can detect a second specific location of the steering wheel 111 at which a phase difference (shift or delay) occurs in response to supplying of the driving signal Vin to the selected first electrode Tx (Tx2) at the second specific location of the steering wheel 111, the human body detecting system 100 can determine the exact location (the second specific location) near the selected first electrode Tx (Tx2) and the second electrode Rx where the human body 112 approaches and/or touches the steering wheel 111. In addition, as described above, a smaller-sized sensor for the human body detecting sensor system 100 can be realized by using multiple small sensors placed around the steering wheel 111.

Figure 2:
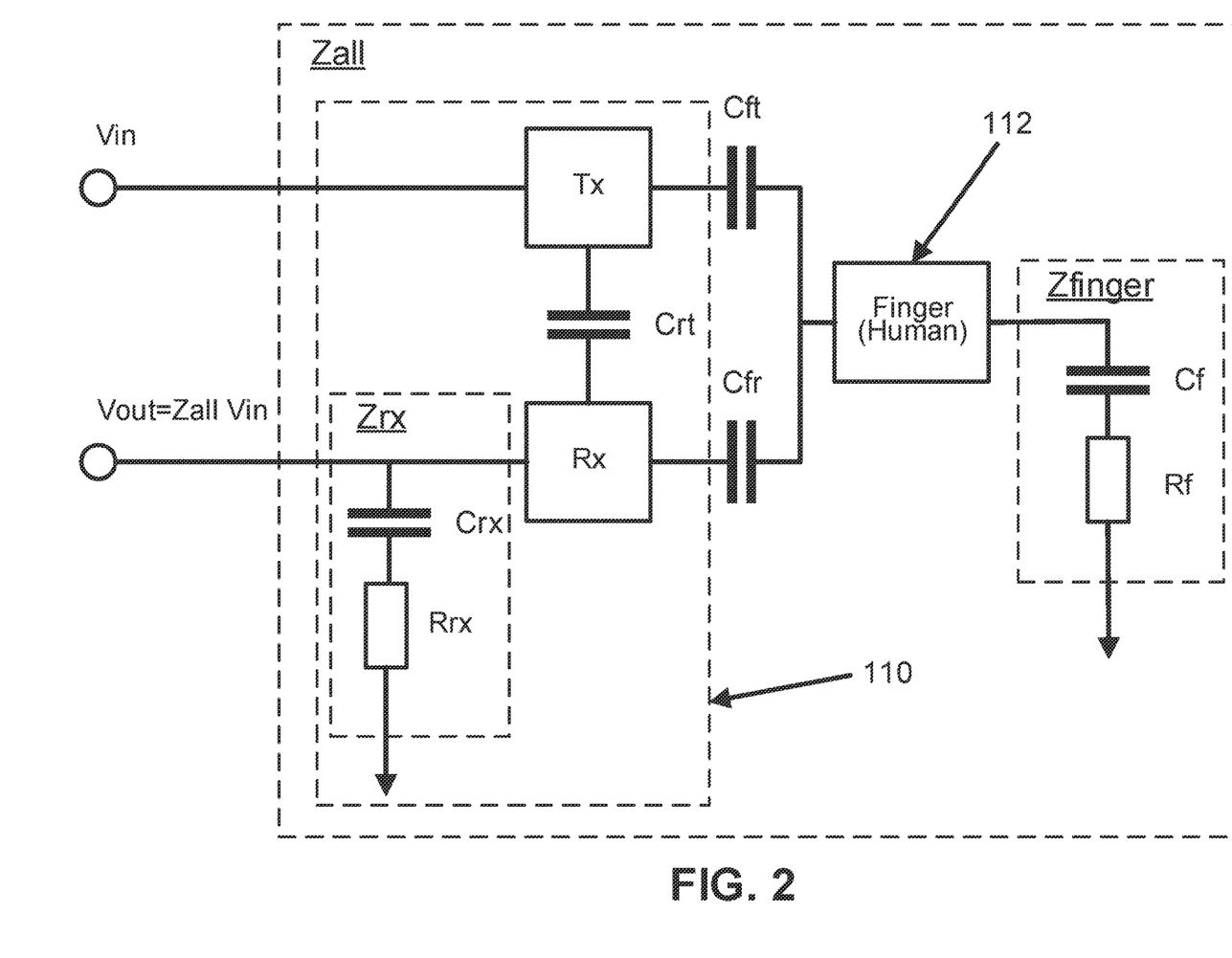
FIG. 2 is an example schematic circuit diagram of a capacitive sensor of a human body detecting system including impedance of a human body.

Referring to FIG. 2, which partially corresponds to the illustration shown in FIG. 1, an example schematic circuit diagram is provided of the sensor module 110 of the human body detecting system 100 including impedance (represent by Cf and Rf) of the human body (e.g., fingers or hands) 112. A capacitor Crt is provided between the first and second electrodes Tx and Rx. A capacitor Crx and a resistor Rrx are provided as an impedance hanging from the second electrode Rx. Capacitances Cft and Cfr are generated between the human body (e.g., fingers or hands) 112 and the first and second electrodes Tx and Rx, respectively, when the human body 112 approaches the first and second electrodes Tx and Rx. The human body (e.g., fingers and hands) 112 has an impedance (represented by a capacitor Cf and a resistor Rf).

The prescribed frequency supplied to the first electrode Tx is changed at the second electrode Rx due to influences from the above described various capacitors and resistors (combined impedance Zall) so that the phase and impedance of the sensed signal Vout are changed or shifted (delayed). Such changes in the phases and amplitudes are caused by the combined impedance Zall between the first electrode Tx and the second electrode Rx. A phase component of the combined impedance Zall corresponds to an angle formed by a real-part component and an imaginary-part component. Thus, the phase component of the combined impedance Zall is changed due to changes in specific capacitance or resistance values.

For example, when a detection target is not positioned near the second electrode Rx and the first electrode Tx, the phase component of the combined impedance Zall is $\phi$. On the other hand, when a detection target is positioned near the second electrode Rx and the first electrode Tx (the detection target approaches and/or contacts the second electrode Rx and the first electrode Tx), the phase component of the combined impedance Zall is $\phi'$. Each of $\phi$ and $\phi'$ is equal to a difference of a phase of the drive signal Vin and a phase of the sensed signal Vout. Because the phase of the drive signal Vin is a reference phase, $\phi$ is 0° (a detection target is not positioned near the second electrode Rx and the first electrode Tx). Thus, if $\phi'$ is equal to or more than 1°, it is determined that a human body approaches and/or contacts the second electrode Rx and the first electrode Tx. Note that as mentioned above, if a grounded conductor, floating conductor, grounded dielectric, or floating dielectric comes in proximity to the sensor element in the steering wheel 111, no phase shift is observed at the sensed signal Vout. However, if the human body 112 comes in proximity to the sensor element, a phase shift is observed because the human body also has a certain amount of an electrical resistance. Further, if the human body is positioned near the second electrode Rx and the first electrode Tx, $\phi'$ is a substantial angle, such as in a range of 1° to 42°, and more particularly in a range of 26° to 42°. Note that as described above, because the phase comparison circuit 160 is used to receive the sensed signal Vout from the second electrode Rx, it may be enough that the detection target may approach and/or contact at least the second electrode Rx to detect such approaching and/or contacting (touching). Thus, in this application, the phrase "the human body 112 (or another object) approaches and/or touches the second electrode Rx and the first electrode Tx" also means "part (e.g., finger or hands) of the human body 112 (or another object) approaches and/or touches at least the second electrode Rx." Since the example sensor module 110 has a large difference between the phase components $\phi$ and $\phi'$ of the combined impedance Zall by setting the parameters and/or the values of the prescribed frequency of the drive signal Vin and the internal impedance (such as Crt and Zrx (Crx and Rrx)), the phase component is only substantially changed due to the approaching and/or contacting (touching) by the human body 112 or an equivalent object that has the same impedance as the human body 112. Note that in general, the human body 112 has a capacitance (e.g., Cf) of 100 pF and a resistance (e.g., Rf) of 510Ω. Conversely, the phase component is not largely changed due to the approaching and/or contacting by a non-human object, such as a liquid (floating conductor) or a grounded conductor (metal).

In some examples with respect to FIG. 2, when a frequency of the drive signal Vin in the example sensor module 110 is adjusted to 10 MHz, a capacitance of the capacitor Crt (between the first and second electrodes Tx and Rx) is adjusted to 10 pF, the capacitances Cft and Cfr are each adjusted to either 0 pF, and the impedance Zrx hanging from the second electrode Rx is adjusted as a capacitance of the capacitor Crx being 10 pF and a resistance of the resistor Rrx being 1Ω, the combined impedance Zall in a case in which a detection target is not positioned near the second electrode Rx and the first electrode Tx is 0.500+ (1.57×10$^{-5}$)i. This combined impedance Zall (not approaching nor contacting (touching)) corresponds to substantially zero degrees (0°) as the phase component $\phi$.

However, when an experimental object (detection target) (an impedance Zfinger (Cf=100 pf and Rf=510Ω) as described above) that has the example impedance as a human body experimental model (for the human body (e.g., fingers or hands) 112) approaches the second electrode Rx and the first electrode Tx at a certain distance thereto where each of the capacitances Cft and Cfr becomes 10 pF (the sensor module 110 in which the various capacitances and resistances are adjusted as described above), the combined impedance Zall is changed to 0.234+0.2086i. This combined impedance Zall (approaching by the human body experimental model) corresponds to about 41.7 degrees (41.7°) as the phase component $\phi'$. This phase difference (shift or delay) (41.7°) of the phase component is deemed fairly large because it is 40° or greater. The phase difference (shift or delay) between the phase component $\phi$ and the phase component $\phi'$ of the combined impedance Zall corresponds to a phase difference (shift or delay) between the drive signal Vin and the sensed signal Vout because the impedance Zfinger, and each of the capacitances Cft and Cfr (either 0 pF or 10 pF) of the experimental object are exemplarily set and the impedance Zrx hanging from the second electrode Rx and the capacitance of the capacitor Crt are also exemplarily set for the above experimental purpose.

Conversely, if a liquid (floating conductor) (Cf=100 pF and Rf=10Ω) approaches and/or touches the second electrode Rx and the first electrode Tx (the sensor module 110 in which the various capacitances and resistances are adjusted as described above), the combined impedance Zall is changed to 0.164+0.00455i. This combined impedance Zall (approaching and/or contacting by the liquid) corresponds to substantially zero degrees (0°) as the phase component $\phi'$. Thus, there is no phase difference (shift or delay) because zero degrees is the same as the phase component $\phi$ of the combined impedance Zall (not approaching nor contacting).

As described above, it is preferred that a phase difference threshold of the phase component d' of the combined impedance Zall between the first electrode Tx and the second electrode Rx be set to 40 degrees (40°). The determination circuit 150 is configured to determine whether the human body 112 approaches and/or contacts (touches) the second electrode Rx and the first electrode Tx (the sensor module 110) if the phase difference (shift or delay) between the phase components φ and φ' is equal to or more than 40°, and more particularly in a range of 40° to 359°. If the phase difference is 360°, it may not be possible to determine whether 360° means there is no phase difference or there is one (or more) cycle difference of the sensed signal Vout. Thus, the upper limit of the range is preferably not 360°. Therefore, when a prescribed range is set as the phase difference (shift or delay) between the phase components φ and d' being equal to or more than 40°, and more particularly in a range of 40° to 359°, and the sensor module 110 and the sensor controller 120 include preselected parameters, such as a sensor size, a physical distance (a capacitance) between the first and second electrodes Tx and Rx, the impedance Zrx hanging from the second electrode Rx, and a prescribed frequency of the drive signal Vin as discussed above, the approaching and/or touching (contacting) of the human body 112 with respect to the second electrode Rx and the first electrode Tx is clearly distinguishable over the approaching and contacting of non-human objects, such as a liquid (floating conductor) or a grounded conductor (metal), based on the phase difference (shift or delay) between the phase component φ and the phase component d' of the combined impedance Zall, i.e., the phase difference (shift or delay) between the drive signal Vin and the sensed signal Vout.

The capacitor Cf and capacitance Cfr are effectively in series. Thus, a series combined capacitance of Cf and Cfr is expressed by "Cf×Cfr/(Cf+Cfr)." The combined capacitance of Cf and Cfr seen from the second electrode Rx strongly depends on the smaller one of the capacitances of Cfr and Cf. Thus, when a difference between the capacitances of Cf and Cfr is large and the detection target approaches and/or contacts (touches) the second electrode Rx of the sensor module 110, the phase of the sensed signal Vout might change significantly even though the detection target has not touched yet, or even when a detection target having a small capacitance other than the human body 112 approaches, the phase might change. Therefore, it is preferred that the capacitances of Cf and Cfr are about the same values. For example, if the human body 112 has the capacitance (100 pF or more) of the capacitor Cf, then the capacitance Cfr should also be 100 pF at the time of approaching and/or contacting (touching) of the second electrode Rx.

Although there are many ways to detect a phase shift of a signal having a certain frequency in general, the sensor module 110 has a detection resolution of around one degree (1°) of phase shift. But, the detection resolution can be selected corresponding to the closeness of the human body (e.g., fingers or hands) 112 to the sensor module 110 (the steering wheel 111 having the first and second electrodes Tx and Rx). Of course, a thickness of rubber, leather, or other material on the steering wheel 111 and a thickness of a driving groves can also be considered. In some examples, the sensor module 110 (and the sensor controller 120) may use a PLL (phase-locked loop) circuit (a combination of a VCO (voltage controlled oscillator) and a phase detector) to detect phase differences (shifts). An output of the PLL is fed into a frequency counter (or an input capture counter) in a microcontroller. Some examples of circuitry options of the sensor module 110 are explained later.

The PLL baseline frequency is preferably tuned to roughly 8 MHz with an RC (resistor-capacitor) circuit. That is, the preferred frequency is between 7 MHz-10 MHZ, inclusive. When the human body (e.g., fingers or hands) 112 comes close to the first and second electrodes Tx and Rx, the frequency changes by a few thousand Hertz. A non-human target will not change the frequency of the PLL. It is preferred to have an active 4 pole band pass or low pass filter directly from the second electrode Rx before returning to the PLL. This configuration greatly reduces any noise, harmonics, or distortions that may creep into the sensed signal Vout from the second electrode Rx.

Figure 3A:
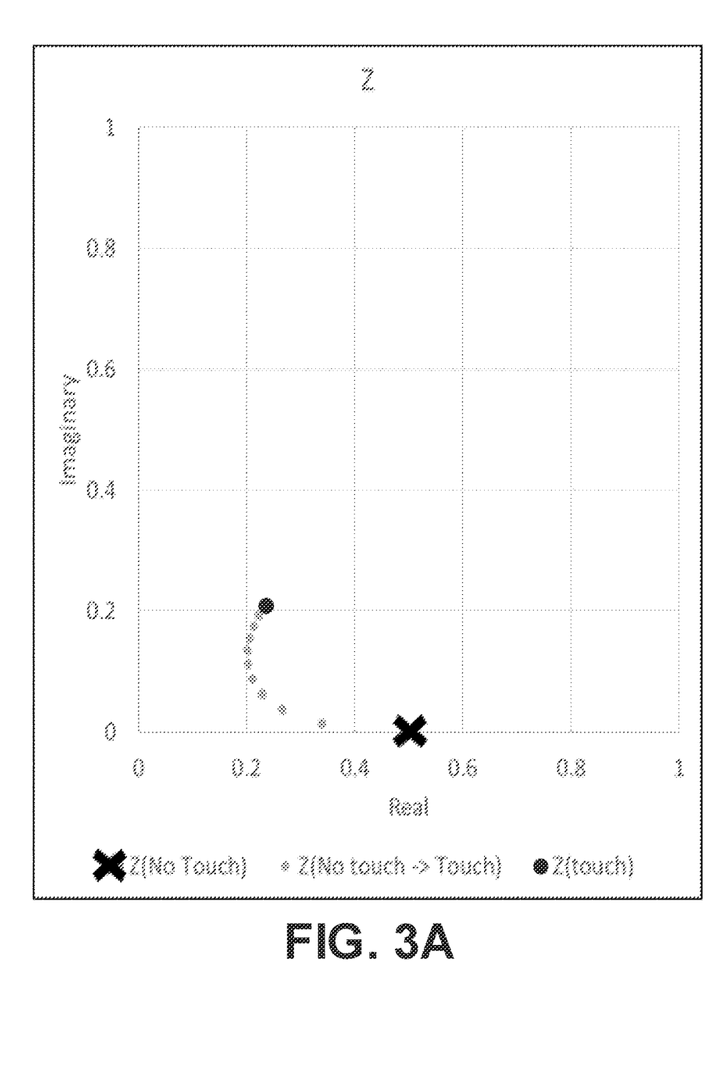
FIGS. 3A and 3B are example graphs showing impedance (phase) changes between a drive signal and a sensed signal of the capacitive sensor shown in FIG. 1.
Figure 3B:
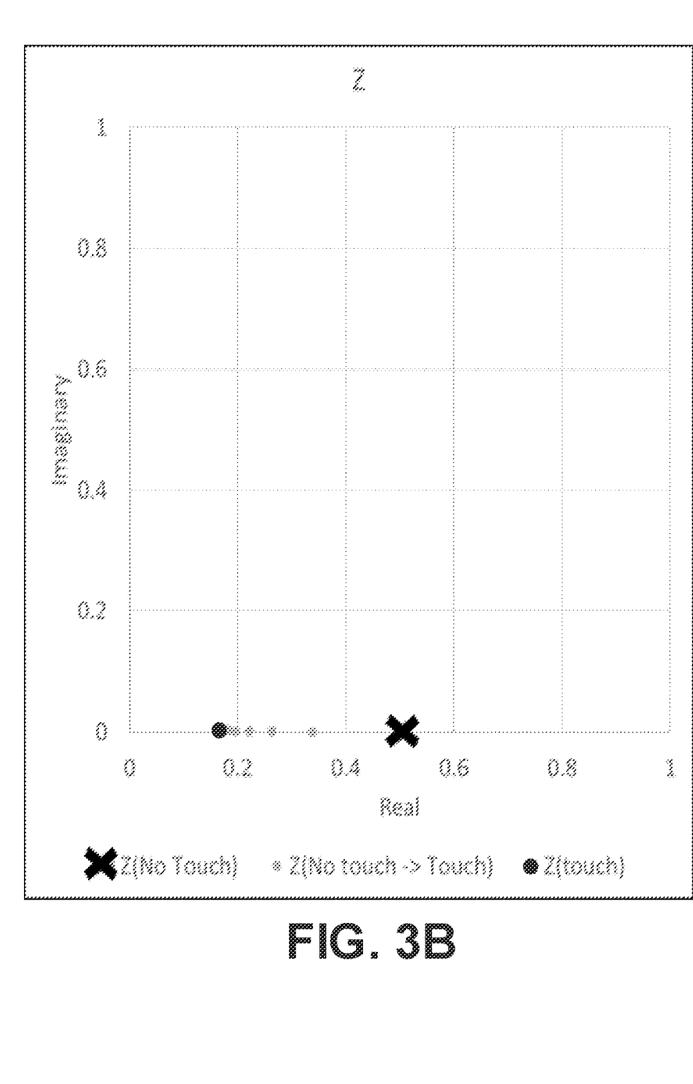

Referring now to FIGS. 3A and 3B, example graphs are provided showing impedance (phase) changes (shifts or delays) between the drive signal Vin and the sensed signal Vout of the sensor module 110 described above. Specifically, FIG. 3A shows the phase changes or shifts until the human body experimental model (the human body 112) approaches and/or touches (corresponding to the largest dot (Z (touch)) and the phase is about 41.7°) the steering wheel 111 having the first and second electrodes Tx and Rx from the state in which the human body experimental model (the human body 112) has not approached and/or touched (corresponding to "X" (Z (No Touch)) and the phase is 0°) the steering wheel 111 having the first and second electrodes Tx and Rx. The phase changes or shifts as the human body experimental model (the human body 112) approaches and/or touches is shown with smaller dots (Z (No touch→Touch)) representing increases of the capacitances Cfr and Cft. Thereafter, each of the capacitances Cfr and Cft reaches 10 pF at the phase shift of 41.7° as shown by the largest dot.

Conversely, FIG. 3B shows the phase changes or shifts until a liquid (floating conductor) approaches and/or touches (corresponding to the largest dot (Z (touch)) and the phase is 0°) the steering wheel 111 having the first and second electrodes Tx and Rx from the state in which the liquid has not approached and/or touched (corresponding to "X" (Z (No Touch)) and the phase is 0°) the steering wheel 111 having the first and second electrodes Tx and Rx. Although the real-part component or the absolute value changes as the liquid approaches (smaller dots (Z (No touch→Touch))), the angle (phase shift) is not substantially changed. Since the sensor module 110 provides clear phase differences (shifts or delays) of the sensed signal Vout (i.e., the phase component of the combined impedance Zall) as shown in FIGS. 3A and 3B, it is possible to discretely detect the approaching and/or touching by objects having an impedance of the human body 112.

Referring now to FIG. 4, another example human body detecting system 200 is shown. The system 200 includes an example sensor module 210 with a second electrode Rx and a sensor controller 220. The sensor module 210 includes a first electrode Tx and the second electrode Rx. The second electrode Rx is arranged in or wrapped around or over a core material of a steering wheel 211 of a vehicle. In some examples, the second electrode Rx may be placed around or cover an entirety of the steering wheel 211. But, the first electrode Tx is not arranged in the steering wheel 211 and instead is arranged elsewhere such as in another component.

In some examples, the first electrode Tx may be arranged under a thick surface materials such as rubber or at a spoke (or a hub or a shaft) of the steering wheel 211. In some examples, the first electrode Tx may simply be a node in a circuit or a trace on a circuit board. Thus, the first electrode Tx may not be exposed at the steering wheel 211. The first electrode Tx and the second electrode Rx are connected via a capacitor Crt which may be a discrete capacitor or the resulting capacitance formed by the proximity of the first electrode Tx to the second electrode Rx. The sensor controller 220 includes a CPU (processor) and a memory, such as a RAM, a ROM, and an EEPROM, a DAC, an ADC, amplifiers, and filters to control a drive circuit 230, a detection circuit 240, a determination circuit 250, and a phase comparison circuit 260 by executing a program or a command stored in the memory by the processor. The detection circuit 240 includes the phase comparison circuit 260. The second electrode Rx (a phase difference between two signals Vin and Vout) detects an approach (i.e., being within a proximity of) and/or a contact (touch) of the steering wheel 211 by a human body (fingers or hands) 212.

The drive circuit 230 supplies a drive signal or an excitation signal (e.g., a sinewave) Vin to the first electrode Tx of the sensor module 210 and the phase comparison circuit 260 in the detection circuit 240. The drive signal Vin has a prescribed frequency, such as 8 MHz or 10 MHz, which can be selected from a plurality of frequencies, such as from a range of 1 MHz to 100 MHz. A sensed signal (e.g., a sinewave) Vout is generated by the second electrode Rx in response to the application of the drive signal Vin to the first electrode Tx. The sensed signal Vout has a frequency corresponding to the prescribed frequency of the drive signal Vin and the capacitor Crt. Thus, depending on the capacitance of the capacitor Crt, a phase and an amplitude of a waveform of the sensed signal Vout may be substantially the same as the phase and amplitude of the drive signal Vin. The sensed signal Vout is supplied to the phase comparison circuit 260 in the detection circuit 240. Further, the sensor module 210 shown in FIG. 4 has an impedance hanging from the second electrode Rx, such as that represented by the capacitor Crx and the resistor Rrx shown in FIG. 4. The capacitance Cfr, which is show in FIG. 2, is omitted from FIG. 4 for ease of illustration.

When the human body 212 approaches (i.e., becomes within a proximity of) and/or contacts (touches) the second electrode Rx in the steering wheel 211, the sensed signal Vout is changed. Specifically, a phase of a waveform of the sensed signal Vout is shifted or delayed for a certain degree compared to a phase of a waveform of the sensed signal Vout when no object approaches and/or contacts the second electrode Rx in the steering wheel 211. In other words, a phase of a waveform of the sensed signal Vout is shifted or delayed for a certain degree compared to a phase of a waveform of the drive signal Vin. These phase differences (shifts or delays) occur due to a resistance capacitance (RC) mix of an impedance. An amplitude of the sensed signal Vout is also changed due to the approaching and touching by the human body 212.

After the phase comparison circuit 260 receives both the drive signal Vin and the sensed signal Vout, the phase comparison circuit 260 compares the two signals Vin and Vout and quantifies a difference between the two signals Vin and Vout. Specifically, the phase comparison circuit 260 compares phases and amplitudes of the two signals Vin and Vout. When the quantified difference with respect to the phases and amplitudes of the two signals Vin and Vout is within a prescribed range, the determination circuit 250 determines that the human body 212 has approached and/or touched (or is approaching and/or is touching) the steering wheel 211. Particularly, as discussed below in detail, when the quantified difference (angle (degree) difference) with respect to the phases of the two signals Vin and Vout is within a prescribed range, such as equal to or more than 1° and equal to or less than 42°, and more particularly equal to or more than 26° and equal to or less than 42°, the determination circuit 250 determines that the human body 212 has approached and/or touched the steering wheel 211.

Conversely, as discussed in detail below, when a liquid (e.g., a floating conductor) or a metal (e.g., a grounded conductor) as a non-human object approaches and/or touches the steering wheel 211, the quantified difference with respect to the phases of the two signals Vin and Vout is outside a prescribed range, or there is no substantial phase difference between the two signals Vin and Vout. Therefore, the determination circuit 260 can accurately and reliably detect the approaching and/or touching of the steering wheel 211 by the human body 212 and distinguish the human body 212 from the approaching and/or touching of the steering wheel 211 by non-human objects. As a result, vehicle safety is improved.

Although a single pair of first and second electrodes Tx and Rx has been explained in the above examples, a plurality of second electrodes Rx may be arranged in the steering wheel 211. For example and as discussed above, FIG. 7 shows the steering wheel 111 with a plurality of electrodes 710 and a circular electrode 720. The circular electrode 720 corresponds to the first electrode Tx and the plurality of electrodes 710 correspond to the plurality of second electrodes Rx. If desired, the circular electrode 720 can be omitted from the steering wheel 111. In this case, each of the plurality electrodes 710 corresponds to a single pair of first and second electrodes Tx and Rx. As a result, each of the plurality electrodes 710 corresponds to a single sensor module 110 or 210.

When the plurality of second electrodes Rx are arranged at several different places in the steering wheel 211, the sensor controller 220 can determine which sensed signal Vout from the various second electrode(s) Rx is changed (shifted or delayed). In this example, when the detection circuit 240 does not detect a phase difference in the sensed signal Vout from the selected second electrode Rx (Rx1) arranged at a first specific location of the steering wheel 211, the human body detecting system 200 can determine that the human body 112 has not approached and/or touched the first specific location of the steering wheel 211. Also, since the detection circuit 140 can detect a second specific location of the steering wheel 111 at which a phase difference (shift or delay) occurs in response to receiving and comparing the sensed signal Vout from the selected second electrode Rx (Rx2) at the second specific location of the steering wheel 211, the human body detecting system 200 can determine the exact location (the second specific location) near the selected second electrode Rx (Rx2) where the human body 212 approaches and/or touches the steering wheel 211. In addition, as shown in FIG. 7, a smaller-sized sensor for the human body detecting sensor system 200 can be realized by using multiple small sensors placed around the steering wheel 211.

The configuration shown in FIG. 4 also has a combined impedance Zall similar to that described with respect to FIG. 2 but does not include the capacitance Cft. However, redundant explanations of the combined impedance Zall are omitted here.

When a detection target is not positioned near the second electrode Rx, a phase component of the combined impedance Zall is. On the other hand, when a detection target is positioned near the second electrode Rx (the detection target approaches and/or contacts the second electrode Rx), the phase component of the combined impedance Zall is φ'. Since the sensor module 210 has a large difference between the phase components φ and d' of the combined impedance Zall by setting the parameters and/or the values of the prescribed frequency of the drive signal Vin and internal impedance (such as Crt and Zrx (Crx and Rrx)), the phase component is only substantially changed due to the approaching and/or contacting (touching) by the human body 212 or an equivalent object that has the same impedance as the human body 212. Conversely, the phase component is not largely changed due to the approaching and/or contacting by a non-human object, such as a liquid (e.g., a floating conductor) or a grounded conductor (e.g., a metal).

In some examples with respect to FIG. 4, when a frequency of the drive signal Vin in the sensor module 210 is adjusted to 20 MHZ, a capacitance of the capacitor Crt (between the first and second electrodes Tx and Rx) is adjusted to 10 pF, the capacitance Cfr is adjusted to either 0 pF, and the impedance Zrx (See FIG. 2) hanging from the second electrode Rx is adjusted as a capacitance of the capacitor Crx being 10 pF and a resistance of the resistor Rrx being 500Ω, the combined impedance Zall in a case in which a detection target is not positioned near the second electrode Rx is 0.545+0.1430i. This combined impedance Zall (not approaching nor contacting (touching)) approximately corresponds to 14.7 degree (14.7°) as the phase component ϕ.

However, when an experimental object (detection target) (an impedance Zfinger (See FIG. 2) (Cf=100 pf and Rf=510Ω as described above) that has the example impedance as a human body experimental model (for the human body (e.g., fingers or hands) 112) approaches (and/or contacting (touching)) the second electrode Rx at a certain distance thereto where the capacitance Cfr becomes 100 pF (the sensor module 210 in which the various capacitances and resistances are adjusted as described above), the combined impedance Zall is change to 0.264+0.229i. This combined impedance Zall (approaching by the human body experimental model) corresponds to about 40.9 degrees (40.9°) as the phase component ϕ'. This phase difference (shift or delay) (26.2°) of the phase component is deemed fairly large because it is 26° or greater. The phase difference (shift or delay) between the phase component ϕ and the phase component ϕ' of the combined impedance Zall corresponds to a phase difference (shift or delay) between the drive signal Vin and the sensed signal Vout because the impedance Zfinger, and the capacitance Cfr (either 0 pF or 100 pF) of the experimental object (as an example of the human body (fingers and hands) 212) are exemplarily set and the impedance Zrx hanging from the second electrode Rx and the capacitance of the capacitor Crt are also exemplarily set for the above experimental purpose.

Note that in the examples relating to FIG. 1, the phase difference (shift or delay) is about 41.7°, the phase component ϕ is about 0°, and the phase component ϕ' is about 41.7°. In the examples relating to FIG. 4, the phase difference (shift or delay) is about 26.2°, the phase component ϕ is about 14.7°, and the phase component ϕ' is about 40.9°. Because the drive signals (10 MHz and 20 MHZ) in FIG. 1 and FIG. 4 and the locations (in the steering wheel 111 or at another component) of the first electrode Tx are different and the states of existing (FIG. 1) or non-existing (FIG. 4) of the capacitance Cft are different (i.e., the setting parameters are different) between the examples relating to FIG. 1 and FIG. 4, the values of the phase differences and the phase components ϕ and ϕ' are different between the examples relating to FIG. 1 and FIG. 4.

Conversely, if a liquid (e.g., a floating conductor) (Cf=100 pF and Rf=10Ω approaches and/or touches the second electrode Rx (the sensor module 210 in which the various capacitances and resistances are adjusted as described above), the combined impedance Zall is changed to 0.147+0.0168i. This combined impedance Zall (approaching and/or contacting by the liquid) corresponds to about 6.5 degrees (6.5°) as the phase component ϕ'. Thus, there is a little phase difference (shift or delay) of only 8.2 degrees (8.2°), which is easily distinguishable from the above phase difference (26.2°).

As described above, it is preferred that a phase difference threshold of the phase component d' of the combined impedance Zall between the first electrode Tx and the second electrode Rx be set to 26 degrees (26°). The determination circuit 250 is configured to determine whether the human body 212 approaches and/or contacts (touches) the second electrode Rx (the sensor module 210) if the phase difference (shift or delay) between the phase components ϕ and ϕ' is equal to or more than 26°, and more particularly in a range of 26° to 359°. If the phase difference is 360°, it may not be possible to determine whether 360° means there is no phase difference or there is one (or more) cycle difference of the sensed signal Vout as described above. Therefore, when a prescribed range is set as the phase difference (shift or delay) between the phase components ϕ and ϕ' being equal to or more than 26°, more particularly in a range of 26° to 359°, more particularly, in a range of 1° to 42°, and yet more particularly in a range of 26° to 42, and the sensor module 210 and the sensor controller 220 are include preselected parameters, such as a sensor size, a physical distance (a capacitance) between the first and second electrodes Tx and Rx, the impedance Zrx hanging from the second electrode Rx, and a prescribed frequency of the drive signal Vin as discussed above, the approaching and/or touching (contacting) of the human body 212 with respect to the second electrode Rx is clearly distinguishable over the approaching and contacting of non-human objects, such as a liquid (floating conductor) or a grounded conductor (metal), based on the phase difference (shift or delay) between the phase component ϕ and the phase component d' of the combined impedance Zall, i.e., the phase difference (shift or delay) between the drive signal Vin and the sensed signal Vout.

The capacitor Cf and capacitance Cfr are effectively in series. Thus, a series combined capacitance of Cf and Cfr is expressed by "Cf×Cfr/(Cf+Cfr)." The combined capacitance of Cf and Cfr seen from the second electrode Rx strongly depends on the smaller one of the capacitances of Cfr and Cf. Thus, when a difference between the capacitances of Cf and Cfr is large and the detection target approaches and/or contacts (touches) the second electrode Rx of the sensor module 210, the phase of the sensed signal Vout might change significantly even though the detection target has not touched yet, or even when a detection target having a small capacitance other than the human body 212 approaches, the phase might change. Therefore, it is preferred that the capacitances of Cf and Cfr are substantially the same values. For example, if the human body 212 has the capacitance (100 pF or more) of the capacitor Cf, then the capacitance Cfr should also be 100 pF at the time of approaching and/or contacting (touching) of the second electrode Rx.

There are many ways to detect a phase shift of a signal having a certain frequency in general. Further, a detection resolution of the detection circuit (140 and 240) and the determination circuit (150 and 250) can be designed corresponding to the closeness of the human body (fingers or hands) 212 to the sensor module 210 (the steering wheel 211 having the second electrode Rx). Of course, a thickness of rubber, leather, or other material on the steering wheel 211 and a thickness of driving groves can also be considered. In some examples, the sensor module 210 (and the sensor controller 220) may use a PLL circuit (a combination of a VCO and a phase detector) to detect phase differences (shifts). An output of the PLL is fed into a frequency counter (or an input capture counter) in a microcontroller. Some examples of circuitry options of the sensor module 210 are explained later.

The PLL baseline frequency is preferably tuned to roughly 8 MHz with an RC circuit. That is, the preferred frequency is between 7 MHZ-10 MHZ, inclusive. When the human body (fingers or hands) 212 comes close to the second electrode Rx, the frequency changes by a few thousand Hertz. A non-human target will not change the frequency of the PLL. It is preferred to have an active 4 pole band pass or low pass filter directly from the second electrode Rx before returning to the PLL. This configuration greatly reduces any noise, harmonics, or distortions that may creep into the sensed signal Vout from the second electrode Rx.

Figure 5A:
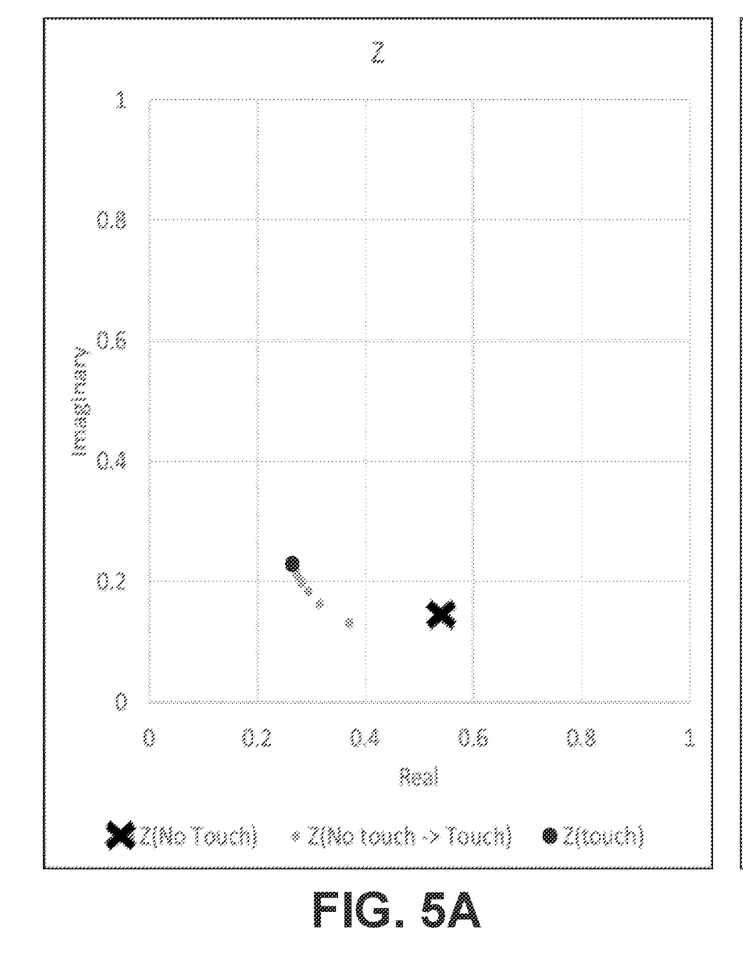
FIGS. 5A and 5B are example graphs showing impedance (phase) changes between a drive signal and a sensed signal of the capacitive sensor shown in FIG. 4.
Figure 5B:
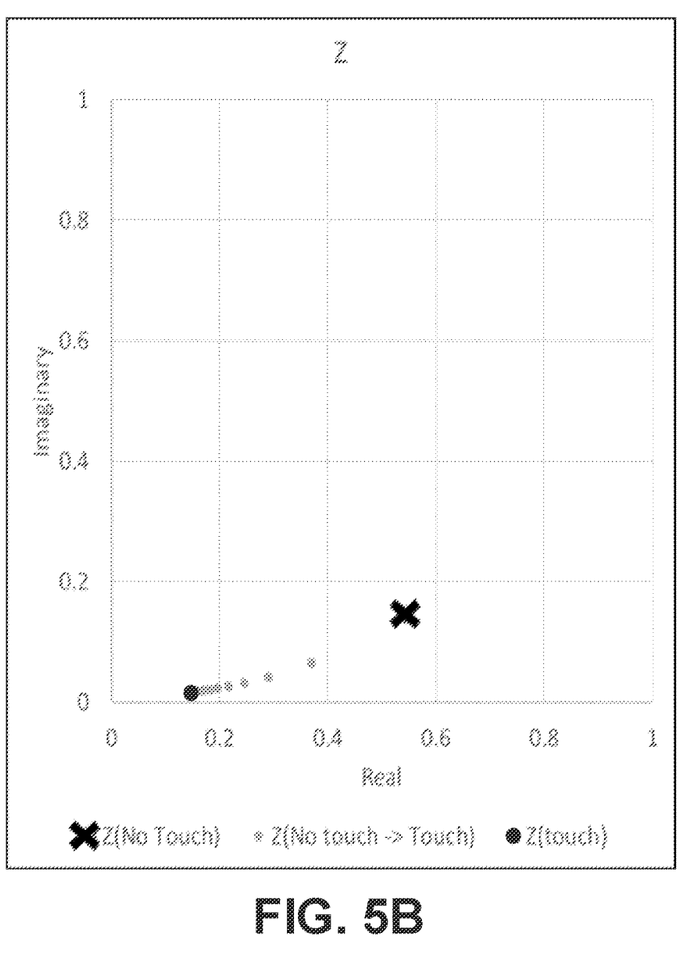

Referring now to FIGS. 5A and 5B, example graphs are provided showing impedance (phase) changes (shifts or delays) between the drive signal Vin and the sensed signal Vout of the sensor module 210 described above. Specifically, FIG. 5A shows the phase changes or shifts until the human body 212 approaches and/or touches (corresponding to the largest dot (Z (touch)) and the phase is about 40.9°) the steering wheel 211 having the second electrode Rx from the state in which the human body 212 has not approached and/or touched (corresponding to "X" (Z (No Touch)) and the phase is about 14.7°) the steering wheel 211 having the second electrode Rx. The phase changes or shifts as the human body 212 approaches and/or touches is shown with smaller dots (Z (No touch→Touch)) representing increases of the capacitance Cfr. Thereafter, the capacitance Cfr reaches 100 pF at the phase shift of 40.9° as shown by the largest dot (Z (touch)).

Conversely, FIG. 5B shows the phase changes or shifts until liquid (floating conductor) approaches and/or touches (corresponding to the largest dot (Z (touch)) and the phase is about 6.5°) the steering wheel 211 having the second electrode Rx from the state in which the liquid has not approached and/or touched (corresponding to "X" (Z (No Touch) and the phase is about 14.7°) the steering wheel 211 having the second electrode Rx. In this case, the phase angle becomes shallower (smaller) as the liquid approaches or touches the steering wheel 211 having the second electrode Rx. Since the sensor module 210 provides clear phase difference (shifts or delays) (more than 26°) of the sensed signal Vout (i.e., the phase component of the combined impedance Zall) as shown in FIGS. 5A and 5B, it is possible to discretely detect the approaching and/or touching by objects having an impedance of the human body 212.

Figure 6:
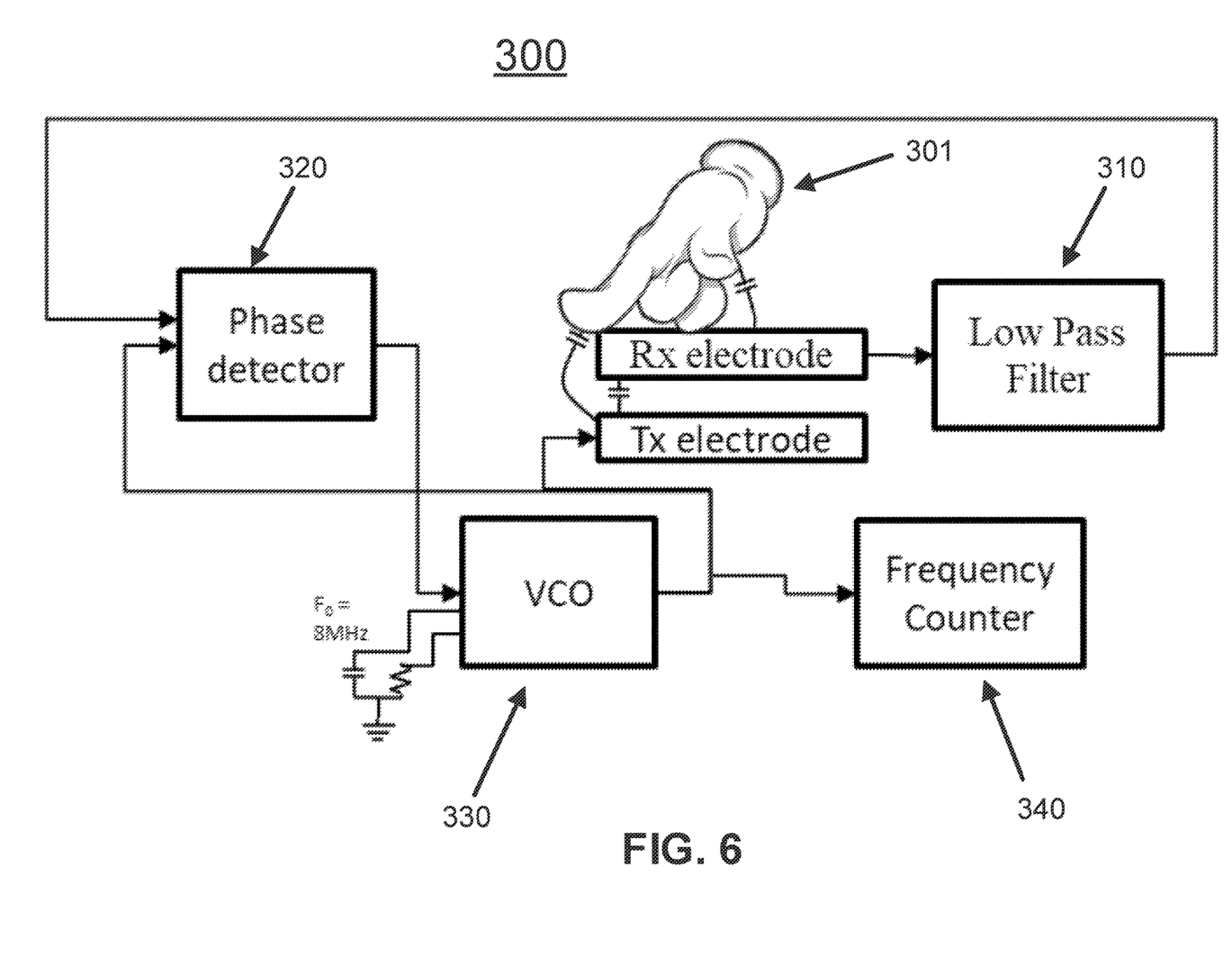
FIG. 6 is an example sensor circuitry including some components of the sensor module and the controller shown in FIGS. 1, 2, and/or 4.

Referring now to FIG. 6, an example sensor circuitry 300 is shown including some components of the sensor module and the controller shown in FIGS. 1, 2, and/or 4. The sensor circuitry 300 includes a Tx electrode (first electrode Tx) and an Rx electrode (second electrode Rx) to which a finger 301 touches, a low pass filter 310, a phase detector 320, a VCO (voltage controlled oscillator) 330, and a frequency counter 340. A combination of the phase detector 320 and the VCO 330 generally forms a PLL circuit.

The sensor module 110 or 210 (and the sensor controller 120 or 220) may use a PLL circuit (a combination of the VCO 330 and the phase detector 320) to detect phase differences (shifts). An output of the PLL is fed into the frequency counter 340 in, for example, a microcontroller. The PLL baseline frequency is preferably tuned to roughly 8 MHz with an RC circuit. That is, the preferred frequency is somewhere between 7 MHz-10 MHz, inclusive. When the human body (fingers or hands) 112, 212, or 301 comes close to the first and second electrodes Tx and Rx, the frequency changes by a few thousand Hertz. A non-human object does not change the frequency of the PLL or changes the frequency in the opposite direction compared to a human touch. An active 4 pole band pass can be used instead of the low pass filter 310 directly from the second electrode Rx before returning to the PLL. Further, another 4 pole low pass (or band pass) filter may be inserted between the VCO 330 and the Tx electrode (first electrode Tx). This configuration greatly reduces any noise, harmonics, or distortions that may creep into the sensed signal Vout from the second electrode Rx.

With respect to a prescribed frequency of the drive signal Vin, an optimum drive frequency (where the phase changes most) strongly depends (inversely proportionally) to the resistance component of a human body. Assuming that the resistance component of the human body is about 500Ω-510Ω, the optimum drive frequency (the phase changes most) for human body detection is in a range of around 1 MHz to around 100 MHz, and more specifically around 10 MHz. Therefore, when the human body is a detection target, it is preferred to use a MHz band as the prescribed (driving) frequency of the drive signal Vin.

As a variation, a phase detector may be made with an XOR gate with the first and second electrodes Tx and Rx as inputs, instead of a PLL circuit. An output pulse width of the XOR gate corresponds to the phase difference (shift). This output pulse width is measured with a high degree of resolution, such as around 100 ps.

Another variation is to use almost any frequency of a square wave for the drive signal Vin for the first electrode Tx and to measure a delay time from an input of the drive signal Vin to the first electrode Tx to an output of the sensed signal Vout from the second electrode Rx with high resolution. This method requires less analog circuits, such as filters. The baseline signal (from a capacitive sensor when no object is near the capacitive sensor) is the delay from the input of the drive signal Vin to the first electrode Tx to the output of the sensed signal Vout from the second electrode Rx without any object near the sensor. When a light touch or touching by a small hand is desired to be detected, the measured delay amount may be a threshold for determining a valid human touch.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A sensor system for detecting a human body comprising:
 a first electrode;
 a second electrode connected to the first electrode via a capacitance;
 a drive circuit configured to generate a first signal having a prescribed frequency, the first signal being supplied to the first electrode;
 a detection circuit configured to detect a second signal generated at the second electrode in response to the first signal supplied to the first electrode; and
 a comparison circuit configured to compare the first signal with the second signal,
 wherein the comparison circuit is configured to detect a touch and/or an approach of the human body with respect to at least one of the first and second electrodes and to distinguish the touch and/or the approach of the human body over a touch and/or an approach of a non-human object when a phase difference between the first signal and the second signal is within a prescribed range, and a size of the second electrode and a thickness of an overlay of the second electrode are set under a condition in which when a surface touched by the human body with respect to the overlay of the second electrode is detected, a capacitance between the human body and the second electrode becomes the same as that of a capacitive component of the human body.

2. The sensor system according to claim 1, wherein the drive circuit is configured to select the predetermined frequency of the first signal from a plurality of frequencies.

3. The sensor system according to claim 2, wherein the capacitance is adjusted based on the selected predetermined frequency of the first signal.

4. The sensor system according to claim 2, wherein an impedance between the second electrode and a ground potential is adjusted based on the selected predetermined frequency of the first signal.

5. The sensor system according to claim 1, wherein the second electrode is arranged in a steering wheel.

6. The sensor system according to claim 5, wherein the first electrode is arranged in the steering wheel.

7. The sensor system according to claim 1, wherein the comparison circuit is configured to detect the touch and/or the approach of the human body with respect to the second electrode and distinguish the touch and/or the approach of the human body over the touch and/or the approach of the non-human object when the phase difference between the first signal and the second signal is within the prescribed range.

8. The sensor system according to claim 1, wherein the prescribed frequency of the first signal is in a range of 1 MHz to 100 MHz.

9. The sensor system according to claim 1, wherein the comparison circuit is configured to detect the touch and/or the approach of the human body, which has an impedance in a certain range corresponding to the human body, with respect to at least one of the first and second electrodes and distinguish the touch and/or the approach of the human body over the touch and/or the approach of the non-human object when the phase difference between the first signal and the second signal is within the prescribed range.

10. The sensor system according to claim 1, wherein the comparison circuit is configured to detect the touch and/or the approach of the human body with respect to at least one of the first and second electrodes and distinguish the touch and/or the approach of the human body over the touch and/or the approach of the non-human object when an amplitude difference between the first signal and the second signal is within another prescribed range.

11. A method for detecting a human body comprising:
generating a first signal having a predetermined frequency;
supplying the first signal to a first electrode and a detection circuit;
detecting a second signal generated at a second electrode in response to the first signal supplied to the first electrode, the first electrode being connected to the second electrode via a capacitance;
comparing a first phase of the first signal and a second phase of the second signal, respectively;
detecting a touch and/or an approach of the human body with respect to at least one of the first and second electrodes distinguishing the touch and/or the approach of the human body over a touch and/or an approach of a non-human object when a phase difference between the first phase and the second phase is within a prescribed range; and
setting a size of the second electrode and a thickness of an overlay of the second electrode under a condition in which when a surface touched by the human body with respect to the overlay of the second electrode is detected, a capacitance between the human body and the second electrode becomes the same as that of a capacitive component of the human body.

12. The method according to claim 11, wherein the predetermined frequency of the first signal is selected from a plurality of frequencies.

13. The method according to claim 12, wherein the capacitance is adjusted based on the selected predetermined frequency of the first signal.

14. The method according to claim 12, wherein an impedance between the second electrode and a ground potential is adjusted based on the selected predetermined frequency of the first signal.

15. The method according to claim 11, wherein the touch and/or the approach of the human body with respect to the second electrode is detected and the touch and/or the approach of the human body is distinguished over the touch and/or the approach of the non-human object when the phase difference between the first signal and the second signal is within the prescribed range.

* * * * *